United States Patent
Aliane et al.

(10) Patent No.: US 10,153,064 B2
(45) Date of Patent: Dec. 11, 2018

(54) GRAPHENE INTERPOSER AND METHOD OF MANUFACTURING SUCH AN INTERPOSER

(71) Applicant: Commissariat A L'Energie Atomique Et Aux Energies Alternatives, Paris (FR)

(72) Inventors: Abdelkader Aliane, Grenoble (FR); Philippe Coronel, Barraux (FR)

(73) Assignee: Commissariat A L'Energie Atomique Et Aux Energies Alternatives, Paris (FR)

(*) Notice: Subject to any disclaimer, the term of this patent is extended or adjusted under 35 U.S.C. 154(b) by 134 days.

(21) Appl. No.: 14/669,319

(22) Filed: Mar. 26, 2015

(65) Prior Publication Data
US 2015/0200034 A1 Jul. 16, 2015

Related U.S. Application Data

(63) Continuation of application No. PCT/FR2013/052712, filed on Nov. 12, 2013.

(30) Foreign Application Priority Data

Nov. 13, 2012 (FR) .................................. 12 60768

(51) Int. Cl.
H01B 1/04 (2006.01)
H05K 1/09 (2006.01)
(Continued)

(52) U.S. Cl.
CPC ............. *H01B 1/04* (2013.01); *H01B 13/003* (2013.01); *H01B 13/0036* (2013.01);
(Continued)

(58) Field of Classification Search
CPC .... H01B 1/04; H01B 13/003; H01B 13/0036; H01L 21/486; H01L 21/6835;
(Continued)

(56) References Cited

U.S. PATENT DOCUMENTS

| 5,827,606 A  * | 10/1998 | Marumoto ............... F02P 7/025 |
| | | 428/209 |
| 2003/0038113 A1* | 2/2003 | Makarov .................... C23F 4/00 |
| | | 216/66 |

(Continued)

OTHER PUBLICATIONS

Thermal Performance of Natural Graphite 2005.*
(Continued)

*Primary Examiner* — Timothy Thompson
*Assistant Examiner* — Guillermo Egoavil
(74) *Attorney, Agent, or Firm* — Burr & Brown, PLLC

(57) ABSTRACT

An interface device comprises a layer of a material thoroughly crossed by metal electrodes intended to electrically connect two electronic circuits. According to the present invention, the layer of material comprises a graphene layer and the electrodes each comprise a central electrically-conductive element formed across the thickness of the graphene layer and an electrically-insulating peripheral layer, interposed between the central element and the graphene layer.

7 Claims, 3 Drawing Sheets

(51) Int. Cl.
  *H01L 23/498* (2006.01)
  *H01L 21/48* (2006.01)
  *H01B 13/00* (2006.01)

(52) U.S. Cl.
  CPC ...... *H01L 21/486* (2013.01); *H01L 23/49827* (2013.01); *H05K 1/09* (2013.01); *H01L 2924/0002* (2013.01); *H05K 2201/0323* (2013.01)

(58) Field of Classification Search
  CPC ............. H01L 23/5384; H01L 23/5389; H01L 23/49827; H01L 24/24; H01L 24/82; H01L 25/105; H01L 29/772; H01L 29/778; H01L 29/1606; H01L 29/41775; H01L 29/42376; H01L 29/7781; H01L 2221/6835; H01L 2221/68327; H01L 2221/68368; H01L 2224/04105; H01L 2224/12105; H01L 2224/24227; H01L 2224/73267; H01L 2225/1058; H01L 2924/0002; H01L 2924/14; H01L 2924/014; H01L 2924/0103; H01L 2924/01005; H01L 2924/01006; H01L 2924/01011; H01L 2924/01013; H01L 2924/01015; H01L 2924/01019; H01L 2924/01027; H01L 2924/01033; H01L 2924/01042; H01L 2924/01046; H01L 2924/01049; H01L 2924/01074; H01L 2924/01079; H01L 2924/01322; H01L 2924/09701; H01L 2924/15153; H01L 2924/15165; H01L 2924/15311; H01L 2924/15331; H01L 2924/30105; H01L 2924/30107; H05K 1/09; H05K 1/115; H05K 1/185; H05K 1/0306; H05K 3/429; H05K 2201/0187; H05K 2201/0323; H05K 2201/0355; H05K 2201/0394; Y10S 977/734

USPC ............ 174/257; 257/29, E21.409, E23.019, 257/E23.174, E23.178, E29.242; 438/151; 977/734
  See application file for complete search history.

(56) References Cited

U.S. PATENT DOCUMENTS

| 2004/0195669 | A1 | 10/2004 | Wilkins et al. |
| 2007/0076467 | A1* | 4/2007 | Yamaoka ............... G11C 11/412 365/154 |
| 2008/0277776 | A1* | 11/2008 | Enomoto ............... H01L 21/486 257/700 |
| 2010/0008123 | A1* | 1/2010 | Scheuerlein ........... B82Y 10/00 365/148 |
| 2010/0019673 | A1* | 1/2010 | Ahn ......................... H01J 11/12 313/585 |
| 2011/0195293 | A1* | 8/2011 | Grant ..................... H01G 9/042 429/143 |
| 2012/0168723 | A1* | 7/2012 | Park ..................... H01L 21/0237 257/29 |
| 2013/0193411 | A1* | 8/2013 | Lee ..................... H01L 21/6835 257/29 |
| 2013/0299782 | A1* | 11/2013 | Afzali-Ardakani ......................... H01L 29/772 257/29 |
| 2015/0111039 | A1* | 4/2015 | Kim ......................... H01B 1/04 428/408 |

OTHER PUBLICATIONS

Superior Thermal Conductivity of Graphene 2008.*
International Search Report (Application No. PCT/FR2013/052712) dated Apr. 15, 2014 (with English translation).

* cited by examiner

GRAPHENE INTERPOSER AND METHOD OF MANUFACTURING SUCH AN INTERPOSER

FIELD OF THE INVENTION

The invention relates to the field of so-called "three-dimensional" integration, where electronic circuits are stacked on one another by means of interface devices, or "interposers", creating an electrical and mechanical connection between circuits.

BACKGROUND OF THE INVENTION

To gain circuit surface and/or to be able to use different manufacturing technologies in a same electronic device, it is known to stack microelectronic circuits, this type of integration being commonly called "3D micropackaging".

Usually, the circuits are electrically and mechanically connected by means of interposers comprising a silicon, glass, or graphite layer thoroughly crossed by metal electrodes in contact with electric areas or tracks of the circuits, thus allowing their communication and/or their electric power supply. In the state of the art, it is desired to have interposers combining the following features for the electrode support layer: a good electric isolation to avoid shorting the electrodes and/or to avoid leakage currents, a good heat conductivity to dissipate the heat, and a positive thermal expansion coefficient as close as possible to the thermal expansion coefficient of the circuits connected to the interposer, which circuits are usually made of materials having a positive thermal expansion coefficient, such as for example semiconductor materials and metals. Such design constraints are for example described in US 2008/0277776 and US 2004/0195669.

While a silicon or glass interposer has a low cost and a good heat dispersion, as the silicon volume decreases due to the thinning of the interposer, for example, for miniaturization reasons, the metal volume of the through connections proportionally becomes more significant, which may cause a significant heating of the interposer.

Further, a silicon interposer has a high rigidity which makes its use difficult in certain applications, for example in the context of electronic skins. Finally, the metals forming the connections have a very high Young's modulus, which embrittles the silicon layer where they are formed.

Further, the through metal electrodes are formed by etching holes in a silicon or glass layer previously formed by a deposition technique, and then by filling these holes with a metal. Now, the forming of through holes having a form factor of good quality, particularly holes having a constant cross-section across the entire thickness of a silicon or glass layer, requires using complex and expensive etching technologies.

To overcome these problems, the use of an interposer made of an organic material, particular of an organochlorine material, such as polychlorinated biphenyls, has been provided. Indeed, polychlorinated biphenyls have the advantage of being flexible and a polychlorinated biphenyl layer provided with regularly-distributed through holes may be simply formed in a single step by means of low-cost manufacturing techniques, particularly by silk-screening.

However, polychlorinated biphenyls are poor heat conductors and cannot by themselves dissipate significant heat flows, often reaching values greater than 300 W/cm$^2$, usually encountered in microelectronic circuits. Heat thus builds up in this type of interposer, causing a thermal shock which damages both the interposer and the circuits to which it is connected. Further, polychlorinated biphenyls have a strong dielectric permittivity for high frequencies, which disturbs the operation of circuits operating at high frequencies.

Further, whatever the type of interposer of the state of the art, a large difference between the positive thermal expansion coefficient of the layer having the electrodes formed therein and the positive thermal expansion coefficient of the metal used for the electrodes can generally be observed. When it is submitted to strong thermal variations, the different portions of the interposer thus expand or contract differently, thus embrittling the assembly.

Finally, the circuits connected through an interposer are also submitted to different contractions or expansions, particularly because they have different expansion coefficients, and/or because they are submitted to different temperature variations, which here again embrittles the assembly.

SUMMARY OF THE INVENTION

The present invention aims at providing an interposer intended to electrically and mechanically connect microelectronic circuits, which is a good heat conductor, which minimizes the expansion and contraction differences likely to occur due to temperature variations in the interposer itself or between the interposer and the circuits to which it is connected, and which may be flexible and/or be manufactured by means of low-cost techniques.

For this purpose, the invention aims at an interface device comprising a layer of material thoroughly crossed by metal electrodes intended to electrically connect two electronic circuits.

According to the invention:
the layer of material comprises a graphene layer; and
the electrodes each comprise:
  a central electrically-conductive element formed across the thickness of the graphene layer; and
  an electrically-insulating peripheral layer, interposed between the central element and the graphene layer.

Graphene layer means a layer substantially only made of graphene. As known, graphene is a two-dimensional carbon crystal. Although graphene may be naturally found in graphite, graphene is different from graphite which has a different crystal structure. Graphene thus has different properties than graphite. While graphite has a positive thermal expansion coefficient, graphene conversely has a negative thermal expansion coefficient.

In other words, graphene is a good heat conductor which may be provided in the form of a layer provided with through holes by means of low-cost techniques, for example, by silk screening.

Further, due to its 2D crystal nature (two dimensions), the graphene layer may be formed on a flexible substrate, particularly made of plastic such as PEN (polyethylene naphthalate) and PET (polyethylene terephthalate).

Finally, graphene is a material having a negative expansion coefficient while the metal forming the electrodes has a positive thermal expansion coefficient. Thus, the graphene contracts while the electrodes expand, thus avoiding any risk of electrode separation. Further, the circuits interconnected by the interposer have positive thermal expansion coefficients. Thus, while these circuits undergo different expansions or contractions, the graphene compensates for this difference while maintaining the circuits in place.

According to an embodiment, the central element is made of copper, and the peripheral layer is made of copper monoxide. Copper has a low electric resistance and has not magnetic property, and thus does not disturb the operation of the circuits connected to the interposer.

The invention also aims at a method of manufacturing an interface device comprising a layer of material thoroughly crossed by metal electrodes intended to electrically connect two electronic circuits.

According to the invention, the method comprises:

forming a graphene layer comprising holes thoroughly crossing it at the locations provided for the electrodes; and filling the holes with electrodes, each comprising:
- a central electrically-conductive element formed across the thickness of the graphene layer; and
- an electrically-insulating peripheral layer, interposed between the central element and the graphene layer.

According to an embodiment, each electrode is formed:

by forming, on a surface of the graphene layer and in the area occupied by the electrode hole, a ring of material absorbing or reflecting an ultraviolet radiation converting by anneal a copper oxide to copper;

by depositing the copper oxide into the hole; and by applying through the ring said ultraviolet radiation to convert the copper oxide portion exposed to said radiation into a central copper element.

In other words, the reduction of the copper oxide into copper by a UV anneal requires no general heating of the device. Further, the application of the UV anneal does not induce, at the electrode level, a significant temperature rise, and thus enables to deposit, if desired, the graphene layer on a plastic support.

Further, the use of the ultraviolet anneal, combined with a ring-shaped mask on an inlet of a hole, enables to form in a single step the central conductive element and the peripheral electric insulator layer insulating the central element from the graphene, which is an electrically-conductive material.

Particularly, the ring is made of gold, titanium, or gold, and its thickness is advantageously greater than 30 nanometers.

Further, the ultraviolet anneal is a photonic pulse having a duration in the range from 0.5 millisecond to 2 milliseconds and having a fluence in the range from 200 Joules to 1,500 Joules, particularly a 1.5-millisecond duration and a 1,400 Joule fluence. Such values thus enable to reduce copper monoxide (CuO) into copper (Cu).

For example, the UV radiation is emitted by a flash lamp of reference "XENON® PulseForge" of Xenon Corporation Xenon, arranged 5 centimeters away from the graphene layer.

BRIEF DESCRIPTION OF THE DRAWINGS

The present invention will be better understood on reading of the following description provided as an example only in relation with the accompanying drawings, where the same reference numerals designate the same or similar elements, among which.

DETAILED DESCRIPTION OF THE INVENTION

Figure 1:
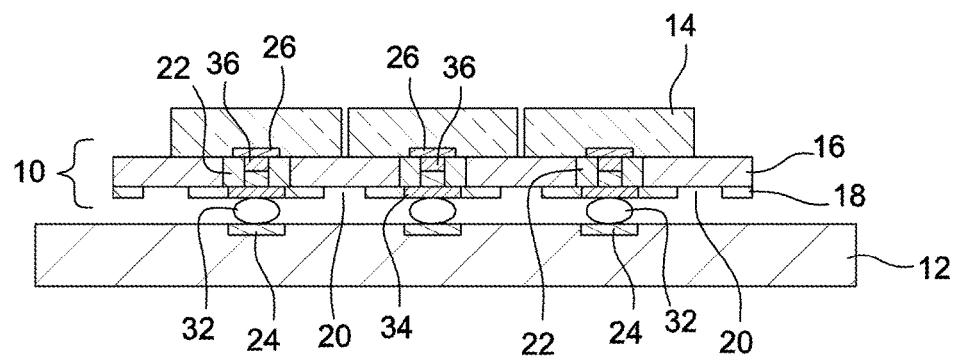
FIG. 1 is a simplified cross-section view of a device according to the invention.
Figure 2:
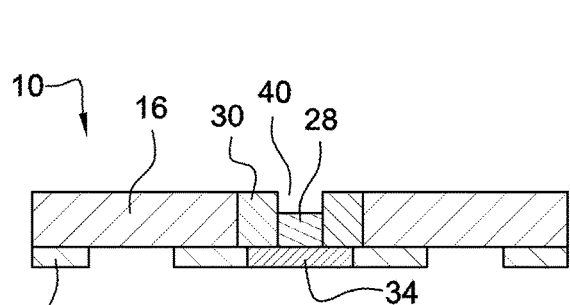
FIG. 2 is a view of a detail of FIG. 1, illustrating an electrode of an interposer according to the invention.
Figure 3:
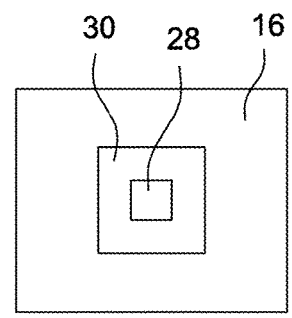
FIG. 3 is a top detail view, illustrating an electrode of an interposer according to the invention.

Referring to the simplified cross-section view of FIG. 1, an interposer according to the invention 10 achieves the electrical and mechanical interconnection between a first and a second microelectronic circuits 12, 14. First circuit 12 is for example a printed circuit board or "PCB" used as a support for the assembly and comprising conductive tracks for the electric power supply and/or the communication of second circuit 14. Second circuit 14 is for example formed of one or a plurality of electronic chips, electrically powered by first circuit 12 through interposer 10.

Interposer 10 comprises a graphene layer 16, optionally deposited on a layer of flexible material 18, particularly a low-cost plastic such as polyethylene naphthalate (PEN), poly-ethylene terephthalate (PET), or polyimide (PI), having heat dissipation openings 20 formed therein.

Interposer 10 also comprises solid through conductive electrodes 22, achieving the electric interconnection between connected areas, tracks, and/or elements 24, 26 of first and second circuits 12, 14.

Each of electrodes 22 comprises a metal core 28 and a peripheral layer 30 made of an electrically-insulating material, interposed between graphene layer 16 and core 22 to electrically insulate core 22 of the electrodes from the graphene, which is an electrically conductive material.

The electro-mechanical connection between interposer 10 and circuits 12, 14 may be achieved by any means known per se in the art. According to a first variation, illustrated by the interconnection of interposer 10 with first circuit 12, the interconnection is achieved by conductive bumps or pads 32. Glue 34 is deposited on electrodes 22 and first circuit 12, provided with conductive elements 32, is placed on interposer 10 to lay elements 32 on glue dots 34.

According to a second variation, the interconnection is achieved by solder bumps 32.

Electrodes 22 are covered on their surface opposite first circuit 12 with an area 34 made of a metal wettable by a solder material, areas 26 of first circuit 12 are also covered or made of such a metal, and interposer 10 and circuit 12 are then electrically and mechanically connected by melting of solder bumps 32, for example, by means of a "flip chip"-type hybridization technique.

According to a third variation, illustrated by the interconnection of interposer 10 with second circuit 14, the interconnection is achieved by means of conductive glue 36, particularly a mixture of epoxy glue with metal particles, such as silver, for example. Glue is for this purpose deposited on the central elements of electrodes 22, and second circuit 14 is placed on interposer 10 to lay connection areas 26 on glue dots 36.

Advantageously, the arrangement of the interconnection elements between interposer 10 and the two circuits 12, 14 is performed to optimize the dissipation of the heat generated by the latter. Particularly, a circuit capable of generating much heat, such as for example, second circuit 14, is advantageously arranged in contact with graphene layer 16, to have a maximum surface area of heat exchange therewith. Graphene is indeed a good heat conductor, having a heat conductivity close to 5,000 W/m·K, and thus allows a significant heat dissipation.

In the case of an interconnection by a conductive glue 36, a cavity 40 is for example formed in central element 28 of each of electrodes 22, and the glue is deposited in cavities 40 to avoid the forming of protruding glue pads preventing the contact of graphene layer 16 with second circuit 14, the glue advantageously defining a gluing surface only flush with the surface of layer 16. Further, cavities 40 enable to increase the surface area of contact between glue 36 and interposer 10, which increases the mechanical behavior of the assembly.

Advantageously, a circuit may also be spaced apart from interposer 10, such as, for example, first circuit 12 due to the presence of solder bumps 32, to also optimize the heat dissipation. Particularly, in the configuration illustrated in FIG. 1, first circuit 12 may be an electric power supply board mainly made of a material which is a poor heat conductor. The present of the air blade thus defined between interposer 10 and first circuit 12 enables to more efficiently dissipate the heat generated by second circuit 14 formed in contact with graphene layer 16. The selection of a contact with the graphene layer or of an air blade or the vacuum of a circuit for example depends on the application and/or on the system manufacturing and operating constraints.

Further, graphene is a material having a negative thermal expansion coefficient, that is, a material which contracts as the temperature rises and which expands as the temperature decreases. Now, metals have positive thermal expansion coefficients, whereby, under the effect of a temperature rise, the electrodes expand. Since, further, the graphene contracts, the electrodes thus always remain in contact with layer 16, so that there is no separation phenomenon.

Further, the materials forming the microelectronic circuits also usually have a positive thermal expansion coefficient. Also, graphene provides a resistance against the geometric variations of circuits 12, 14. For example, when the first and second circuits are submitted to different temperature rises, and thus attempt to expand differently, the graphene layer conversely undergoes a contraction which opposes the expansion of the circuits and thus decreases the resulting expansion difference. In an advantageous variation, the two circuits 12, 14 are each arranged in contact with graphene layer 16, for example, by means of glue as previously described, to maximize the restoring force exerted by graphene layer 16.

A method of manufacturing an interposer according to the invention as well as a method of stacking said interposer with the first and second circuits as described previously will now be described.

Figure 4:
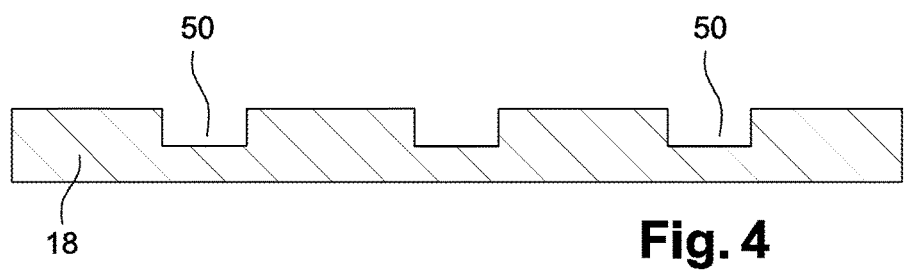
FIGS. 4 to 15 are simplified views illustrating a method of manufacturing an interposer and a circuit according to the invention.

The method starts with the forming of a flexible substrate transparent to ultraviolet radiation 18. Particularly, the substrate is made of a low-cost plastic layer, for example, made of PEN, PET, or PI and has a thickness in the range from 25 micrometers to 50 micrometers. Cavities 50 are then formed in a surface of substrate 18 at the locations desired for electrodes 22 of interposer 10, for example, by means of a photolithography implementing an etching with methyl benzoate, or by an etching with an oxygen plasma ($O_2$) and/or sulfur hexafluoride ($SF_6$). Cavities 50 for example have a circular or square cross-section, a width in the range from 50 micrometers to 100 micrometers, and a depth in the range from 1 micrometer to 5 micrometers (FIG. 4 in cross-section view).

Figure 5:
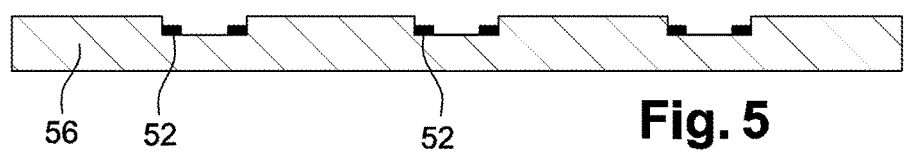
Figure 6:
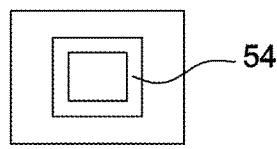
Figure 7:
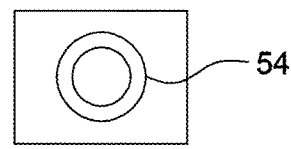

The method then carries on with the forming of a ring 52 made of a material absorbing or reflecting ultraviolet radiation, in the bottom of each cavity 50 and in contact with the edge of the cavity. For example, ring 52 is made of gold, platinum, silver, or of an organic material blocking ultraviolet radiation, such as pyrene, for example (FIG. 5 in cross-section view and FIGS. 6 and 7 in top view respectively illustrating a ring having a square cross-section and a ring having a circular cross-section).

Rings 52 are for example formed by means of a physical vapor deposition through a mask, or of a full-plate deposition followed by a wet etching or an excimer plasma etching, or by means of a silk-screening or of an inkjet printing.

The thickness of ring 52 is selected to be smaller than the depth of cavities 50, and preferably in the range from 20 nanometers to 50 nanometers, and advantageously a 30-nanometer thickness for gold, this thickness being sufficient to efficiently block the ultraviolet radiation described hereafter. The diameter or the internal dimensions of rings 52 are selected according to the dimensions desired for the central elements of electrodes 22. The width of rings 52 is selected according to the width desired for insulating ring 30 separating core 22 from the electrodes of graphene layer 16, and is in the range from 5 micrometers to a few tens of micrometers when this layer is made of CuO.

At a next step, surface 56 undergoes a surface treatment improving the bonding of a graphene layer subsequently deposited thereon. Particularly, this treatment comprises applying an ozone plasma ($O_3$) combined with the application of a UV radiation for a time period in the range from 2 minutes to 20 minutes, followed by the application of an oxygen plasma for several tens of seconds, particularly 60 seconds. Such a surface treatment results in increasing the surface roughness and in removing possible organic residues present on surface 56.

Figure 8:
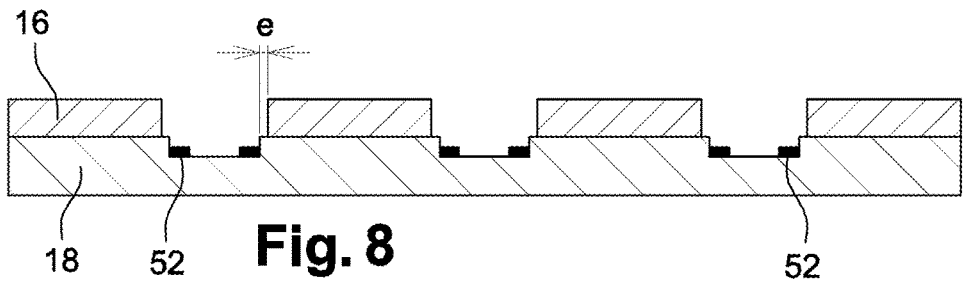

The method then carries on with the deposition of a graphene layer 16 on surface 56 of substrate 18 while leaving cavities 50 free, for example, a layer having a thickness in the range from 25 micrometers to 100 micrometers (FIG. 8 in cross-section view).

Advantageously, the graphene is deposited by means of a low-cost technique, particularly by silk screening using a graphene ink having a solvent of cyclohexane type, which for example enables to obtain a graphene layer formed of a stack of graphene nanosheets, each nanosheet having a thickness of a few atomic layers. As a variation, the graphene layer is obtained by an inkjet deposition technique or by vapor deposition. Preferably, the graphene is deposited so as to be recessed with respect to the edges of cavities 50 by a width "e" in the range from 5 micrometers to 10 micrometers to ascertain that graphene is not deposited in cavities 50, and particularly on rings 52, and/or the viscosity of the graphene ink, and/or the wettability of surface 56 is adapted so that the spreading of the ink before its full drying does not make it flow into cavities 50.

Once the graphene ink has been deposited, an anneal at a temperature in the range from 100° C. to 130° C. is applied for a time period longer than 10 minutes, particularly a time period in the range from 10 minutes to 30 minutes, to evaporate the ink solvents and thus solidify graphene layer 16.

Figure 9:
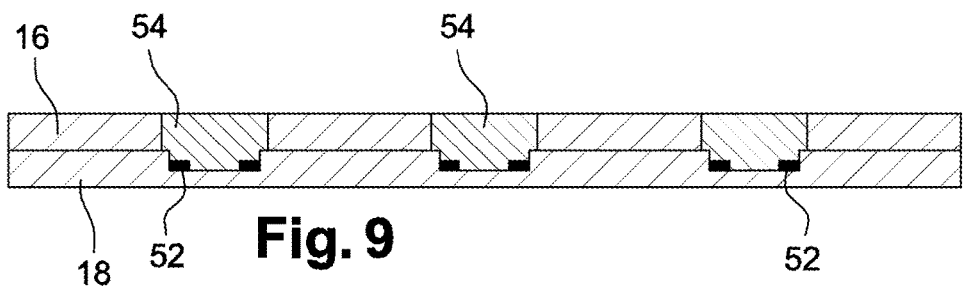

At a next step, cavities 50 are then totally or partially filled, for example, across a thickness in the range from 20 micrometers to 100 micrometers, with copper monoxide (CuO) 54 (FIG. 9 in cross-section view), for example, by means of a silk screening or inkjet printing depositing a water-based CuO ink, and preferably by spraying of this ink when small deposition thicknesses are desired. For example, the CuO ink is an ink bearing reference "Metalon® ICI-020" or "Metalon® ICI-021" of Novacentrix, Tex., USA.

An anneal at a temperature in the range from 100° C. to 130° C. is then applied for from 10 to 30 minutes to dry the ink and thus solidify CuO 54.

Figure 10:
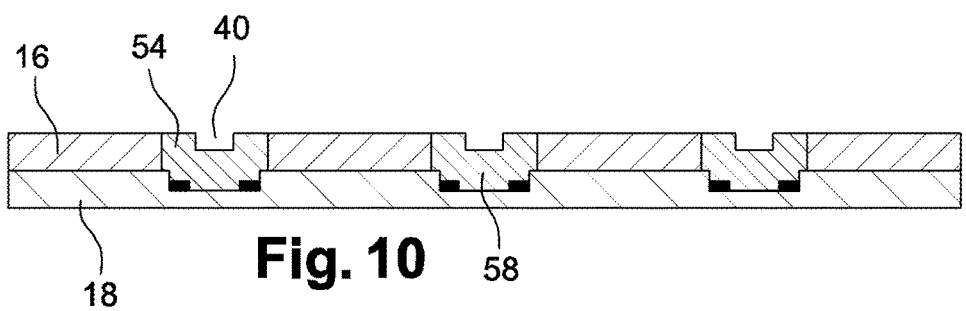

The method then carries on with a local etching at the center of CuO elements 54 to form cavities 40 subsequently receiving glue, as previously described (FIG. 10 in cross-section view).

Figure 11:
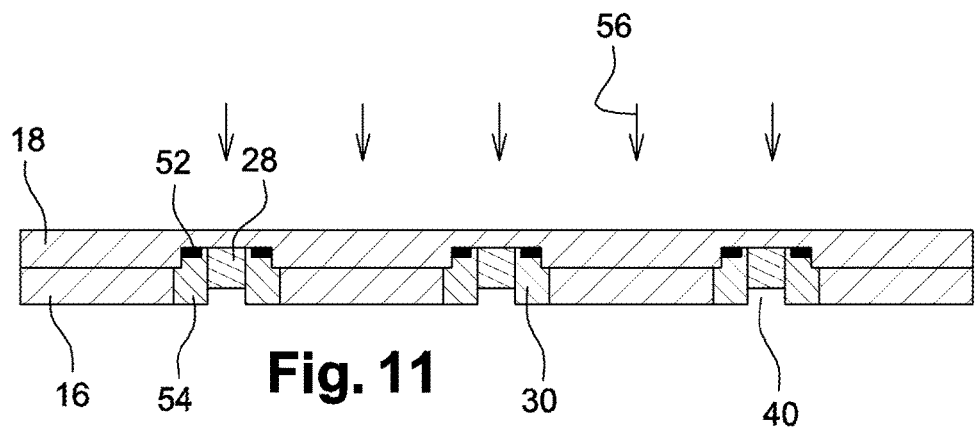

The method then carries on with the application of a photonic pulse in the ultraviolet wavelength range 56, particularly having a wavelength in the range from 200 nanometers to 700 nanometers, through substrate 18 vertically in line with each CuO pad 54, the pulse being for example applied to the entire surface of substrate 18 (FIG. 11 in cross-section view).

Ultraviolet pulse 56 has a duration in the range from 0.5 millisecond to 2 milliseconds, and an energy in the range from 200 Joules to 1,400 Joules, advantageously a 1.5-millisecond duration and a 1,400-Joule energy. Such energy values enable to convert CuO into Cu from the rear surface of the plastic PEN or PET substrate. Pulse 56 is for example generated by a flash UV lamp, particularly a "XENON® PulseForge" flash lamp of Xenon Corporation. Advantageously, the distance separating the lamp from component 10 is in the range from 3 centimeters to 7 centimeters, and more particularly 5 centimeters. This distance being the distance at which the optical system of the Xenon lamp focuses the sent light pulse, that is, the distance at which the energy is maximum.

UV pulse 56 then crosses substrate 18, and is incident on copper oxide portion 58 comprised in each ring of absorbing material 52. At the same time, ring 52 of absorbing or reflective material blocks at least part of the ultraviolet pulse and thus at least partially prevents this pulse from reaching the copper oxide portion present under ring 52. Ultra-violet pulse 62 then induces an anneal of the copper oxide present in rings 52, which undergoes a reduction into copper (Cu), thus forming copper conductive cores 28 of electrodes 22 of interposer 10. Thus copper oxide, which is a poor electric conductor with a resistance per square in the order of $10^6$ $\Omega/\square$, is reduced into copper, which is a good electric conductor having a resistance per square equal to 60 m$\Omega/\square$.

Further, the anneal is carried out locally, that is, at the level of pads 54, and not on the entire substrate 18, and the anneal further induces a temperature lower than 100° C., and thus a temperature lower than the vitreous transition temperature of the plastic forming substrate 18.

Figure 12:
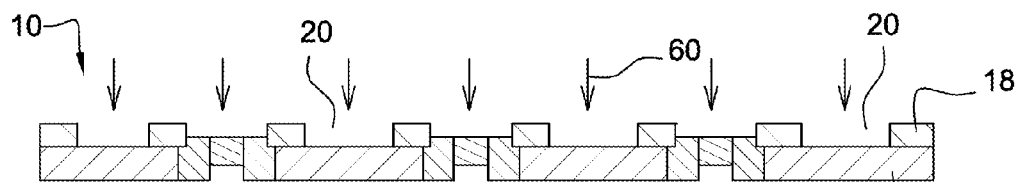

At a next step, openings are formed in substrate 18 to expose pads 54. Optionally, additional openings 20 are formed in substrate 18 all the way to graphene layer 16 to increase the dissipation of heat flows by the latter (FIG. 12 in cross-section view). The openings in substrate 18 are for example formed by an excimer laser or UV etching 60. Preferably, the openings formed to expose pads 54 form rings for the subsequent reception of glue volumes, which thus enables to avoid the spreading thereof and/or their contact with graphene layer 16.

As a variation, substrate 18 is entirely removed, which provides a maximum dissipation of heat flows.

Preferably, rings 52 are also removed, for example, by implementing an excimer laser or UV etching, which has the advantage of being selective and of not etching graphene, copper, and copper monoxide, the etching stopping on these elements.

Figure 13:
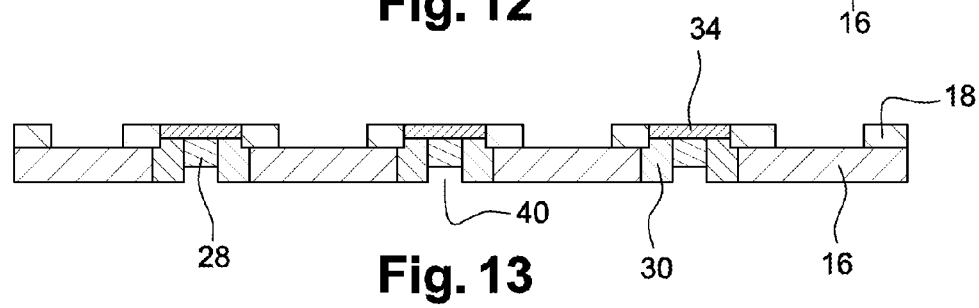

The method then carries out with the actual hybridization of interposer 10 just formed with first and second circuits 12, 14. Particularly, volumes of glue 34 are deposited on the surfaces of electrodes 22 opposite to the surfaces where cavities 40 are formed, for example, a mixture of epoxy glue with metal particles, particularly silver, manufactured by Heraeus. The deposition is for example performed by silk screening through a mask or by a robotized arm which deposits glue dots at the desired locations only (FIG. 13 in cross-section view). At the same time, first circuit 12 is provided with solid conductive bumps, or "stud bumps", particularly made of gold.

Figure 14:
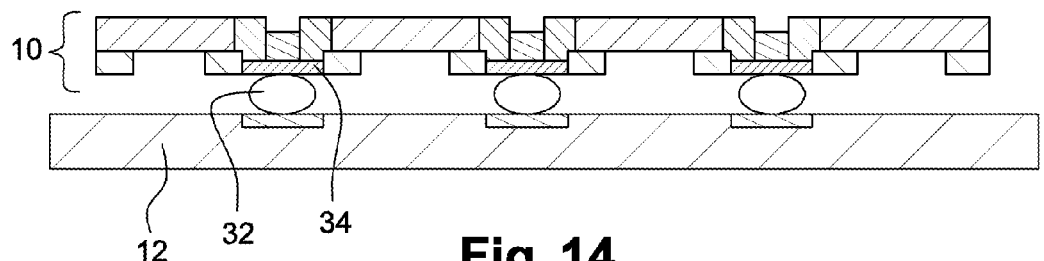

While glue 34 has not solidified yet, interposer 10 and first circuit 12 are hybridized to place bumps 32 into contact with glue dots 34, and then an anneal at a temperature in the range from 60° C. to 90° C. is applied for a time period in the range from 5 minutes to 30 minutes to solidify the glue (FIG. 14 in cross-section view).

Figure 15:
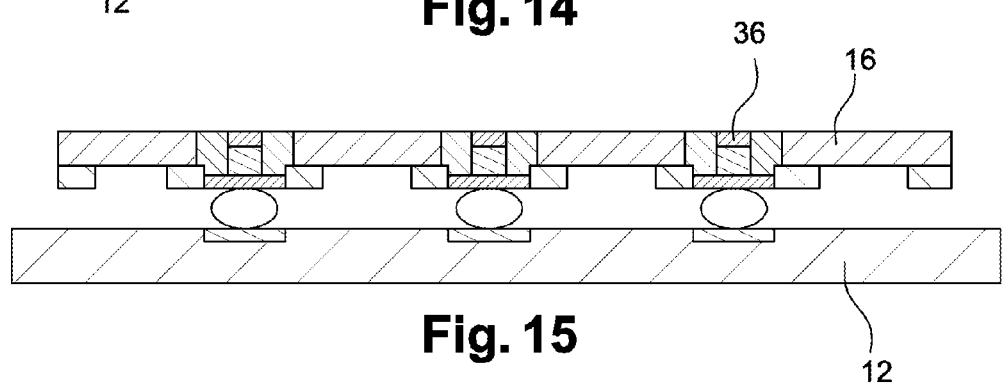

The method then carries on with the hybridization of second circuit 14 and of interposer 10 by filling cavities 40 formed in electrodes 22 with conductive glue 36, for example, that described hereabove (FIG. 15 in cross-section view), by placing second circuit 14 on interposer 10 to place into contact glue dots 36 with connection areas 26 of second component 14, and then by applying an anneal such as previously described to solidify the assembly (FIG. 1).

An embodiment where electrodes 22 of the interposer are obtained by performing a partial UV flash of a CuO pad to simultaneously define an insulating layer and a conductive core for each electrode has been described.

Figure 16:
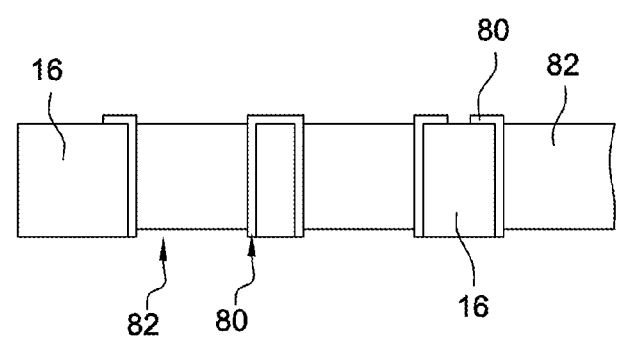
FIG. 16 is a simplified cross-section view illustrating an alternative interposer according to the invention.

Other types of electrodes are of course possible. Particularly, as illustrated in FIG. 16, the edges of the cavities present in graphene layer 16 before filling thereof with a conductive material may be covered with an insulating layer 80, after which a conductive material, for example, copper, titanium, or nickel may then be deposited into the cavities to form central conductive elements 82 of the interposer electrodes. For example, insulating layers 80 are formed by depositing a metal layer by sputtering on the cavity edges, and then by applying an oxygen plasma, which oxidizes the deposited metal and thus forms a metal oxide layer of very high electric conductivity, which is thus insulating.

Interposers formed of a single graphene layer crossed with electric connections have been described. As a variation, a layer of a conductive or insulating material may be deposited on one and/or the other surface of the graphene layer, such as for example a thin metal layer, particularly made of copper, gold, or titanium, while avoiding for said layer to be in contact with the through connections to avoid a short-circuit. Although such an additional layer partly compensates for the negative expansion coefficient of the graphene layer, this enables to implement additional functions.

The invention claimed is:

1. An interface device comprising:
a layer of material thoroughly crossed by metal electrodes that electrically connect two electronic circuits;
wherein the layer of material comprises a graphene layer having a negative thermal expansion coefficient;
wherein the electrodes each comprise
a central electrically-conductive element formed through a thickness of the graphene layer, and
an electrically-insulating peripheral layer, interposed between the central electrically-conductive element and the graphene layer; and
wherein the central electrically-conductive element is made of copper, and wherein the peripheral layer is made of copper monoxide.

2. A method of manufacturing the interface device according to claim 1, the method comprising the steps of:
forming the graphene layer comprising holes thoroughly crossing said layer in locations provided for the electrodes; and
filling the electrode holes with the electrodes.

3. The method of manufacturing the interface device according to claim 2, further comprising the steps of:
- forming, on a surface of the graphene layer and in each area occupied by the electrode holes, a ring of a material that absorbs or reflects ultraviolet radiation;
- depositing copper oxide (CuO) into the electrode holes; and
- applying an ultraviolet anneal step through the ring whereby said ultraviolet radiation converts the copper oxide (CuO) portion exposed to said radiation into a central copper (Cu) element to thereby form each said electrode.

4. The method of manufacturing the interface device of claim 3, wherein the ring is made of gold, titanium, or silver.

5. The method of manufacturing the interface device of claim 3, wherein the ring has a thickness greater than 30 nanometers.

6. The method of manufacturing the interface device of claim 3, wherein the ultraviolet anneal step is achieved by a photonic pulse having a duration in the range from 0.5 millisecond to 2 milliseconds and having a fluence in the range from 200 Joules to 1,500 Joules, particularly a 1.5-millisecond duration and a 1,400 Joule fluence.

7. The method of manufacturing the interface device according to claim 2, wherein the central electrically-conductive element is made of copper, and wherein the peripheral layer is made of copper monoxide.

* * * * *